TRANSMITTER FREQUENCY GENERATION SYSTEM
Filed Nov. 13, 1956
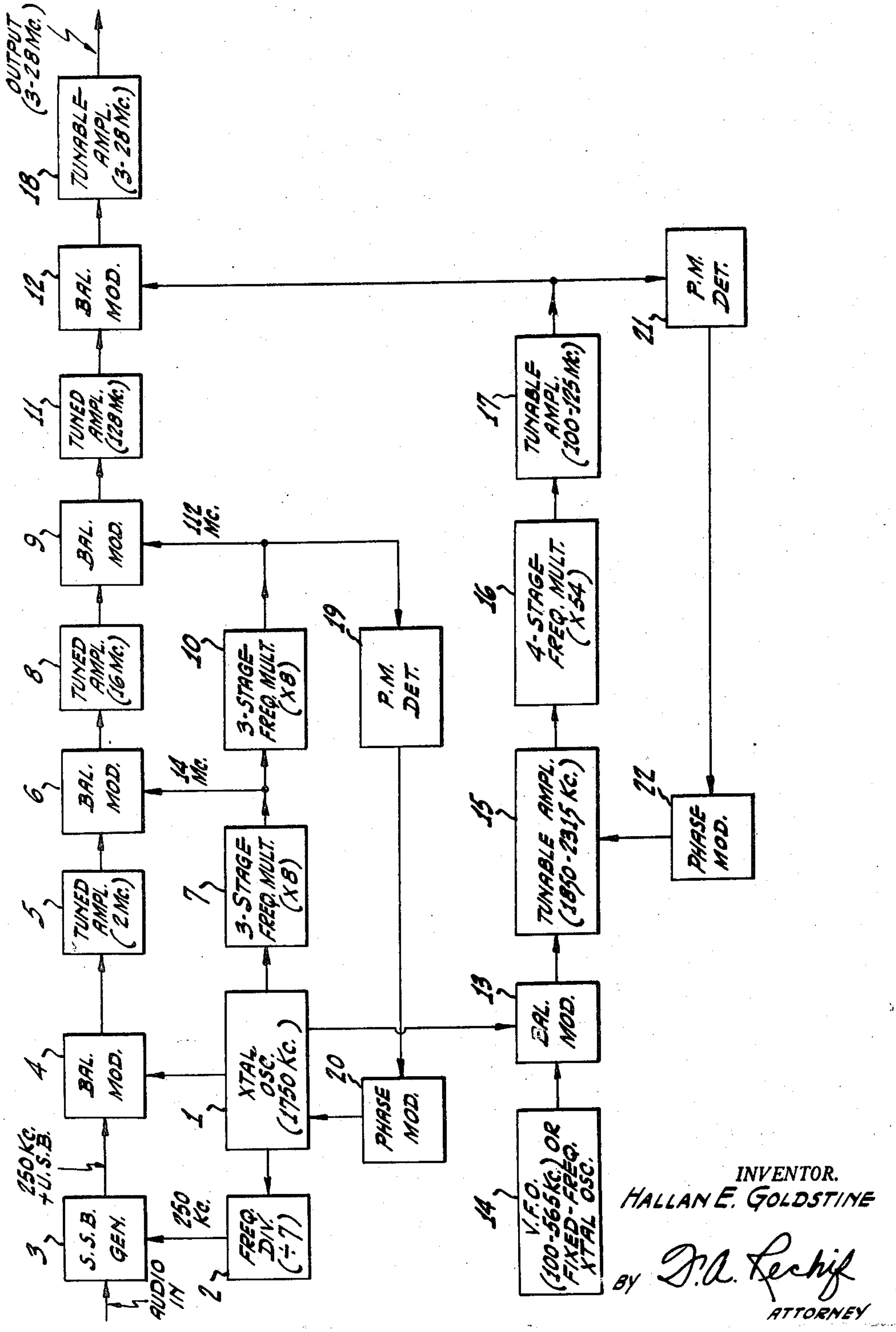
INVENTOR.
HALLAN E. GOLDSTINE
BY D. A. Rechif
ATTORNEY United States Patent Office 2,872,646

Patented Feb. 3, 1959

2,872,646

TRANSMITTER FREQUENCY GENERATION SYSTEM

Hallan E. Goldstine, Port Jefferson Station, N. Y., assignor, by mesne assignments, to the United States of America as represented by the Secretary of the Navy Application November 13, 1956, Serial No. 621,599

5 Claims. (Cl. 332—41)

This invention relates to a system for generating a wide range of output frequencies for a transmitter, and has particular utility for a single sideband (SSB) transmitter.

In the usual, conventional type of linear SSB transmitter, a low radio frequency (R. F.) carrier signal (in the range of 100 to 400 kc., for example) is modulated with the audio intelligence signal and either the upper or lower sideband is selected by means of selective filters. If separate modulators and filters are provided, both sidebands may be used for independent transmissions. In the low R. F. range of 100 to 400 kc., it is possible to provide the filters with enough selectivity to remove the undesired sideband. The carrier signal is usually balanced out by using a balanced modulator for this modulation; the carrier may be reintroduced at the desired (suppressed) level after the selective filters. The output of the balanced modulator is converted in frequency to a fixed intermediate frequency (I. F.) of say 2.8 mc., amplified linearly (to preserve the envelope shape) and combined with energy from a high frequency crystal oscillator or other frequency determining source to produce the desired output frequency. However, in a communication system covering several frequency ranges, several different I. F.'s will be required to properly cover the output frequency band, so that several frequency converter stages are needed. The choice of the converter frequencies and the number of frequency conversions is usually based upon the practical considerations of trying to cover the desired output frequency range with sufficient selectivity, and also to remove the undesired beat frequencies produced in the frequency converters.

As an example, suppose that the audio signal modulates a 100 kc. carrier and the upper sideband is passed through the SSB selective filter in the output of the modulator. If a 1000-C. P. S. tone is used, the output of the filter would be 101 kc. The carrier may be reinserted at the desired level and the signal amplified and then converted to 2.8 mc. I. F. by mixing with a 2.7-mc. signal. The I. F. signal (2.8 mc.+1 kc.) is then amplified and converted again to produce the final output frequency. Usually for the lower output frequencies of the band, the final heterodyning frequency is above the 2.8-mc. I. F. signal. For example, if a 4-mc. output frequency is desired, a final heterodyning frequency of 6.8 mc. is used and the difference frequency provides the 4-mc. output. If a lower output frequency is desired, for example 2.8 mc., then it would be necessary to use a different I. F. because it would be very difficult to separate the 2.8-mc. input signal (which in this case would be one of the inputs to the final heterodyne mixer) from the 2.8-mc. output signal. Thus, a lower I. F. would be required below a certain output frequency, to insure the proper elimination of undesired output beats. However, to maintain sufficient selectivity to remove the carrier and the other sideband at the higher output frequencies, it is desirable to use a relatively high I. F. as one input to the final frequency converter or heterodyne mixer. By way of example, if an output frequency of 30 mc. is desired, then usually the high frequency crystal frequency, 27.2 mc., and the 2.8-mc. I. F. signal are added to produce the output frequency. The 27.2-mc. signal and other spurious beat frequency signals produced in the final frequency converter will have to be removed, or be greatly reduced, mainly by selectivity, so that the transmitter output is free of spurious beats produced in the frequency conversion or modulation process. So, a higher I. F. is desirable. Thus, with the usual or conventional linear SSB system, several I. F.'s are required to properly cover the output frequency band. In addition, for some output frequencies the high frequency crystal energy and the I. F. signal energy must be added, while for other output frequencies these two components must be subtracted. Also, other combinations or beat products of the high frequency crystal and signal appear in the output of the final frequency converter, and when these fall near the output frequency, produce interference and spurious signals in the transmitter output. More specifically, harmonics of the signal frequency may be produced in the frequency converter and these may produce beats, at certain output frequencies, in the desired output band. For example, suppose a 5.6-mc. output frequency is desired. The high frequency crystal frequency would be 8.4 mc., to produce a difference frequency, with the 2.8-mc. I. F. signal, of 5.6 mc. However, the second harmonic of the 2.8-mc. signal frequency is also 5.6 mc., and this frequency would not be removed by the selectivity and may cause interference in the desired output band.

To summarize the foregoing, the conventional linear SSB system, to cover an output frequency band of say 2 to 28 mc., requires a number of different I. F.'s to obtain output practically free of undesired beats. Also, when using such a system it is necessary to break this frequency range into several bands, to obtain the proper selection of the manner of combining the high frequency crystal energy with the I. F. signal energy.

An object of this invention is to provide a frequency generation system which renders unnecessary the expedients required with prior systems and which are set forth in the preceding paragraph.

Another object is to provide, in a multi-range communications transmitter, a linear frequency conversion circuit arrangement wherein a wide ratio of maximum to minimum frequencies is produced in the output, while requiring only a single variable frequency heterodyning source characterized by a relatively small ratio of maximum to minimum frequencies.

The objects of this invention are accomplished, briefly, in the following manner: by means of a series or cascade of balanced modulators which operate essentially at fixed frequencies, the output of an SSB generator is raised to a high signal frequency. This is done by feeding to each modulator a respective carrier current the frequency of which is high compared to the frequency of the sideband energy (or of the output energy from the preceding modulator in the series) fed to the same modulator, and selecting from the output of each modulator the desired sideband of the modulation components applied thereto. Usually, the upper sideband (sum frequency) is so selected, though this is not essential and there may be occasions when it is desirable to select the lower sideband (difference frequency). The successive balanced modulators are fed with heterodyning energy of successively higher (carrier) frequencies derived from a suitable source. The output of a variable frequency oscillator (or of a fixed-frequency crystal oscillator, if a fixed final output frequency is desired) is heterodyned and multiplied up in frequency to produce a high variable frequency (or, alternatively, a high fixed frequency), and the aforementioned high signal frequency and high variable (or fixed) frequency are subtracted in a frequency converter (e. g., a balanced modulator) to produce the final variable (or fixed) output frequency. The high signal frequency and the high variable (or fixed) frequency thus applied to the final frequency converter are both much greater than the final variable (or fixed) output frequency of the system. Phase modulation correcting means are provided in both the signal frequency and variable (or fixed) frequency channels, to reduce the undesired phase modulation effects produced by hum, microphonics, etc.

A detailed description of the invention follows, taken in conjunction with the accompanying drawing, wherein the single figure is a block diagram of a transmitter frequency generation and conversion system according to this invention.

Referring to the drawing, the system of this invention will be explained. The frequency values given in the drawing are for purposes of illustration only, and may not necessarily be the optimum frequencies for a practical application. A stable frequency source 1 of 1750-kc. energy, which may be a quartz crystal oscillator, is used as one of the primary frequency determining sources. The 1750-kc. energy is divided by seven in a frequency divider 2 to provide 250-kc. carrier frequency energy for a SSB generator 3. If desired, a separate source of 250-kc. carrier energy could be used to provide carrier frequency energy for SSB generator 3. Audio frequency energy or other energy of modulation frequency is fed to generator 3 via the connection labeled "Audio In." Amplitude modulation occurs in generator 3, with the production of sidebands, and the upper sideband is selected from generator 3 and this (250 kc. + upper sideband) output signal is passed on as one of the two inputs to balanced modulator 4, which is the first of a plurality of balanced modulators arranged in cascade. Alternatively, in some cases the lower sideband could be selected from generator 3. In modulator 4, the output signal of SSB generator 3 is converted in frequency by mixing therewith carrier energy of 1750 kc. derived directly from oscillator 1. In modulator 4, the sum frequency of 2000 kc. (2 mc.) is produced, along with other frequencies, and this 2-mc. sum frequency is selected from the output of modulator 4 by means of a tuned amplifier 5 (which is tuned to 2 mc.), and passed on as one of the inputs to the second balanced modulator 6. Energy of 1750 kc. from crystal oscillator 1 is multiplied by a factor of eight in a three-stage frequency multiplier 7 to produce 14-mc. carrier energy which is supplied as the other input to balanced modulator 6. In modulator 6, the sum frequency of 16 mc. is produced, along with other frequencies, and this 16-mc. sum frequency is selected from the output of modulator 6 by means of a tuned amplifier 8 (which is tuned to 16 mc.), and passed on as one of the inputs to the third balanced modulator 9. Energy of 14 mc. from the output of frequency multiplier 7 is multiplied by a factor of eight in a three-stage frequency multiplier 10 to produce 112-mc. carrier energy with is supplied as the other input to balanced modulator 9. In modulator 9, the sum frequency of 128 mc. is produced, along with other frequencies, and this 128-mc. sum frequency is selected from the output of modulator 9 by means of a tuned amplifier 11 (which is tuned to 128 mc.).

It may be noted that the frequencies of the carrier currents supplied to modulators 4, 6, and 9 (which frequencies are 1750 kc., 14 mc., and 112 mc., respectively) are high compared to the frequencies of the SSB generator or modulator outputs fed to these same modulators (which latter frequencies are 250 kc., 2 mc., and 16 mc., respectively). Also, the carrier energies fed to the successive modulators 4, 6, and 9 are successively higher in frequency.

It has been stated, in the foregoing description, that the sum frequency (that is, the upper sideband of the various modulation components) is selected from the output of each of modulators 4, 6, and 9. However, the difference frequency (the lower sideband of the modulation components) can instead be selected from the output of any or all of the modulators 4, 6, and 9. If the difference frequency is selected, there results an inversion of the sideband with respect to the carrier. In actual practice, the desired sideband of the modulation components is selected from each modulator.

The 128-mc. energy passed by amplifier 11 is of course sideband energy, since it contains the upper sideband which appears at the output of the SSB generator 3. The high frequency energy passed by amplifier 11 is of relatively fixed frequency, since the carrier is fixed at 128 mc. because of the highly stable crystal-controlled frequencies applied to generator 3 and to modulators 4, 6, and 9. The (128 mc. + upper sideband) energy passed by amplifier 11 is of a frequency (128 mc.) which is high as compared to that (250 kc.) of the original sideband energy out of SSB generator 3. In other words, the signal frequency in the final converter (balanced modulator) 12, to one input of which the output of amplifier 11 is coupled, is very high as compared to that of the original sideband energy out of generator 3.

Energy of 1750 kc. from oscillator 1 is combined in a balanced modulator 13 with energy from a stable variable frequency oscillator 14, which may have a frequency range of 100 to 565 kc., for example. Or, if a fixed frequency final output is desired, a selected crystal oscillator frequency in this range may be used at 14. In modulator 13, the sum frequency of 1850 to 2315 kc. is produced, along with other frequencies, and this sum frequency is selected from the output of modulator 13 by means of a tunable amplifier 15 (which is tunable over the range of 1850 to 2315 kc.). The tunable selective circuit 15 provides a clean signal free of spurious beats. The output of amplifier 15 is multiplied in frequency by a four-stage fixed frequency multiplier 16 which provides a multiplication factor of 54. Frequency multiplier 16 is of the bandpass type and has sufficient selectivity to remove the undesired beats.

The output of multiplier 16 has a frequency in the range of 100 to 125 mc., and this output is passed through an amplifier 17 which is tunable over the range of 100 to 125 mc. The output of amplifier 17 serves as the final high frequency carrier current for the system of this invention. This carrier has a frequency range of (100–125 mc.) which is high as compared to the frequency (250 kc.) of the carrier used to produce the sideband energy in the SSB generator 3. The high frequency carrier in the output of amplifier 17 is of relatively fixed frequency, since its two components (one being crystal oscillator 1 and the other being the stable variable frequency or fixed-frequency oscillator 14) are both very stable. The carrier frequency in the final converter (balanced modulator) 12, to the other input of which the output of amplifier 17 is coupled, is very high as compared to that of the original carrier (out of frequency divider 2) which is used for generating the original sideband energy, in SSB generator 3.

The final frequency conversion (in balanced modulator 12) is done at a high frequency. The high frequency sideband energy (output of amplifier 11, at 128 mc.) is applied to balanced modulator 12 along with the high frequency carrier current (output of amplifier 17 in the range of 100 to 125 mc.). In modulator 12, the difference frequency in the range of 3–28 mc. is produced, along with other frequencies, and this desired output frequency (difference frequency) is selected by a tunable amplifier (selective tuned circuit) 18 which is tunable over the frequency range of 3–28 mc. Amplifier 18 is properly gang-tuned with amplifier 17, amplifier 15, and variable frequency oscillator 14 in such a way as to cover the entire band of output frequencies (that is, the range of 3–28 mc.) without switching. Of course, if a fixed-frequency output is desired (using a fixed-frequency oscillator at 14) this gang tuning is not necessary.

It may be noted that the signal (high frequency sideband energy) at the output of modulator 9 and amplifier 11 has a frequency of 128 mc., which is much greater than that of the final output frequency (range of 3–28 mc.) at the output of modulator 12 and amplifier 18. It may also be noted that the high frequency carrier current at the output of frequency multiplier 16 and amplifier 17 has a frequency in the range of 100 to 125 mc., which is likewise much greater than that of the final output frequency at the output of modulator 12 and amplifier 18. As previously stated, the high frequency sideband energy passed by amplifier 11, and the high frequency carrier current in the output of amplifier 17, are both of relatively fixed frequency. Since this is so and since the signal (sideband) and the carrier frequency in the final converter or modulator 12 are both much higher in frequency than the output signal, proper frequency selection can easily be used to remove some of the aforementioned undesirable effects of the usual, conventional type of linear SSB transmitter system.

It may be noted that the system of this invention, to cover an output frequency band of say 3 to 28 mc., unlike the conventional system does not require a number of different I. F.'s to obtain output free of undesired beats; in the present system the various I. F.'s employed (250 kc., 2 mc., 16 mc., and the final high frequency of 128 mc.) are all used throughout the output frequency band of 3 to 28 mc. Also, the two high frequencies mixed in the final converter (balanced modulator) 12 are always subtractively combined throughout the output frequency range, unlike the practice in the conventional system. Furthermore, the output frequency (the difference frequency out of modulator 12) can readily cover a wide range, say 3 to 28 mc. or more than a 9:1 frequency ratio of maximum to minimum frequencies, while only a relatively small ratio of maximum to minimum frequencies at the amplifier 17 output is required; this amplifier is tunable over the range of approximately 100–125 mc., a ratio of maximum to minimum frequencies of only 1.25:1.

In the example given, the final output frequency is determined in the following manner. It may be seen that $1750+\Delta f$=crystal frequency in kc, where $\Delta f$=frequency variation. Then, the frequency of the high frequency sideband energy is $$\frac{1750+\Delta f}{7}+(1750+\Delta f)+8(1750+\Delta f)+64(1750+\Delta f)=73\tfrac{1}{7}(1750+\Delta f)$$

If $M$=other oscillator frequency to be added (frequency of oscillator 14), and $\Delta z$=frequency variation of this oscillator, then the frequency of the high frequency carrier current is $$54[(1750+\Delta f)+(M+\Delta z)]=54(1750+\Delta f)+54(M+\Delta z)$$

Since the final output frequency is the difference frequency, it is $$73\tfrac{1}{7}(1750+\Delta f)-54(1750+\Delta f)-54(M+\Delta z)$$

or $$33{,}500+19\tfrac{1}{7}\Delta f-54M-54\Delta z \qquad (1)$$

If $M$=100 kc., which is the frequency of oscillator 14 at one end of its range, the output frequency is, from Equation 1

$$33{,}500-5{,}400=28{,}100 \text{ kc. (28.1 mc.)}$$

If $M$=565 kc., which is the frequency of oscillator 14 at the other end of its range, the output frequency is, from Equation 1

$$33{,}500-30{,}510=2{,}990 \text{ kc. (2.99 mc.)}$$

It is possible to have the combining frequency source 14 of 100–565 kc. calibrated in terms of the output frequency, so that the system can be readily, without calculation, set up for the desired output frequency.

The drawing shows a number of frequency multiplier stages 16 from the sum of 1750 kc. crystal+(100 to 565) kc. oscillator (developed at the output of amplifier 15), in order to produce the variable high frequency carrier current for modulator 12. However, if a fixed final output frequency is desired, a high frequency carrier current oscillator of satisfactory frequency stability could be used to supply carrier frequency energy to the final converter 12, thus eliminating the multiplier stages 16.

Since the frequency components used for the final output frequency are multiplied, the phase modulation caused by hum and microphonics might possibly be deleterious at the final output frequency. This may be seen from an examination of Equation 1 above, from which it may be seen that, as regards the output frequency, the phase modulation proportional to $\Delta f$ is multiplied by $19\tfrac{1}{7}$, and the phase modulation proportional to $\Delta z$ is multiplied by 54. According to this invention, the undesired phase modulation is reduced in the following way. Part of the high frequency of the high frequency (112-mc.) output of frequency multiplier 10 is fed to a phase modulation detector 19 of any suitable type. The output of this detector will contain phase modulation components but no amplitude modulation components. The phase modulation components from the output of detector 19 are applied to the input of the phase modulator 20. Modulator 20 phase modulates the crystal oscillator 1 in such a way that the phase modulation produced in 1 is 180° out of phase with the disturbing phase modulation appearing in the output of multiplier 10. Thus, a negative feedback loop is established which will reduce the phase distortion in the frequency multiplier 10. In other words, the output phase modulation (of multiplier 10) of hum, microphonics, etc., is fed back to phase modulate the crystal oscillator 1 to reduce this undesirable effect.

Similarly, part of the high frequency carrier (100–125 mc.) output of amplifier 17 is fed to a phase modulation detector 21. The phase modulation components from the output of detector 21 are applied to the input of the phase modulator 22, which phase modulates the combined output frequency (of 1850 to 2315 kc., in amplifier 15) in such a way that the phase modulation produced in 15 is 180° out of phase with the disturbing phase modulation appearing in the output of amplifier 17. In other words, the correction phase modulation is fed back to phase modulate the energy in amplifier 15 to reduce the undesirable phase modulation appearing in the output of amplifier 17. Thus, both of the phase modulation correcting means 19, 20 and 21, 22 reduce the undesired phase modulation effects produced by hum, microphonics, etc.

What is claimed is:

1. A transmitting system comprising a plurality of balanced modulators arranged in cascade, means for applying sideband energy resulting from modulation of a carrier to the first modulator, a source of energy of stable frequency, means for deriving from said source a plurality of carrier currents equal in number to the number of balanced modulators, means for applying respective ones of said derived carrier currents to each of said modulators, the frequencies of the respective applied carriers increasing in order with the order of the respective balanced modulator, means for selecting from the output of each modulator the upper sideband of the modulation components appearing therein, thereby to produce in the output of the last of said modulator sideband energy of a frequency which is high compared to that of said applied sideband energy, an oscillator, means for mixing energy from said oscillator with energy from said source to produce beat frequency energy, means for multiplying in frequency said beat frequency energy to produce a carrier current having a high frequency compared to the frequency of the carrier used to produce said applied sideband energy, means for mixing said high frequency sideband energy with said high frequency carrier current to produce sum and difference frequencies, and means for selecting the difference frequency produced in said mixing means.

2. A transmitting system comprising a plurality of balanced modulators arranged in cascade, means for applying sideband energy resulting from modulation of a carrier to the first modulator, a source of energy of stable frequency, means for deriving from said source a plurality of carrier currents equal in number to the number of balanced modulators, means for applying respective ones of said derived carrier currents to each of said modulators, the frequencies of the respective applied carriers increasing in order with the order of the respective balanced modulator, means for selecting from the output of each modulator the upper sideband of the modulation components appearing therein, thereby to produce in the output of the last of said modulators sideband energy of a frequency which is high compared to that of said applied sideband energy, a variable frequency oscillator, means for mixing energy from said oscillator with energy from said source to produce beat frequency energy of variable frequency, means for multiplying in frequency said beat frequency energy to produce a carrier current which is variable in frequency and whose frequency is high as compared to the frequency of the carrier used to produce said applied sideband energy, means for mixing said high frequency sideband energy with said high frequency carrier current to produce sum and difference frequencies, and means for selecting the difference frequency produced in said mixing means, thereby to produce final sideband energy the frequency of which is varied as said last-mentioned carrier current is varied in frequency.

3. A transmitting system comprising a plurality of balanced modulators arranged in cascade, means for applying sideband energy resulting from modulation of a carrier to the first modulator, a source of energy of stable frequency, means for applying carrier current derived directly from said source to said first modulator, a plurality of cascaded frequency multiplying stages fed with energy from said source, means for deriving respective carrier currents of multiplied frequency from successive spaced points in the array of frequency multiplying stages and for applying the last-named carrier currents to respective modulators subsequent to the first in such a way that the frequencies of the respective applied carriers increase in order with the order of the respective balanced modulator, means for selecting from the output of each modulator the upper sideband of the modulation components appearing therein, thereby to produce in the output of the last of said modulators sideband energy of a frequency which is high compared to that of said applied sideband energy, an oscillator, means for mixing energy from said oscillator with energy from said source to produce beat frequency energy, means for multiplying in frequency said beat frequency energy to produce a carrier current having a high frequency compared to the frequency of the carrier used to produce said applied sideband energy, means for mixing said high frequency sideband energy with said high frequency carrier current to produce sum and difference frequencies, and means for selecting the difference frequency produced in said mixing means.

4. A transmitting system comprising a plurality of balanced modulators arranged in cascade, means for applying sideband energy resulting from modulation of a carrier to the first modulator, a source of energy of stable frequency, means for applying carrier current derived directly from said source to said first modulator, a plurality of cascaded frequency multiplying stages fed with energy from said source, means for deriving respective carrier currents of multiplied frequency from successive spaced points in the array of frequency multiplying stages and for applying the last-named carrier currents to respective modulators subsequent to the first in such a way that the frequencies of the respective applied carriers increase in order with the order of the respective balanced modulator, means for selecting from the output of each modulator the upper sideband of the modulation components appearing therein, thereby to produce in the output of the last of said modulators sideband energy of a frequency which is high compared to that of said applied sideband energy, a variable frequency oscillator, means for mixing energy from said oscillator with energy from said source to produce beat frequency energy of variable frequency, means for mutliplying in frequency said beat frequency energy to produce a carrier current which is variable in frequency and whose frequency is high as compared to the frequency of the carrier used to produce said applied sideband energy, means for mixing said high frequency sideband energy with said high frequency carrier current to produce sum and difference frequencies, and means for selecting the difference frequency produced in said mixing means, thereby to produce final sideband energy the frequency of which is varied as said last-mentioned carrier current is varied in frequency.

5. A transmitting system comprising a source of energy of stable frequency, means for dividing the frequency of energy from said source to produce a first carrier frequency, means for modulating said first carrier frequency to produce sideband energy, a plurality of balanced modulators arranged in cascade, means for applying said sideband energy to the first modulator, means for applying carrier current derived directly from said source to said first modulator, a plurality of cascaded frequency multiplying stages fed with energy from said source, means for deriving respective carrier currents of multiplied frequency from successive spaced points in the array of frequency multiplying stages and for applying the last-named carrier currents to respective modulators subsequent to the first in such a way that the frequencies of the respective applied carriers increase in order with the order of the respective balanced modulator, means for selecting from the output of each modulator the upper sideband of the modulation components appearing therein, thereby to produce in the output of the last of said modulators sideband energy of a frequency which is high compared to that of said applied sideband energy, a variable frequency oscillator, means for mixing energy from said oscillator with energy from said source to produce beat frequency energy of variable frequency, means for multiplying in frequency said beat frequency energy to produce a carrier current which is variable in frequency and whose frequency is high as compared to the frequency of the carrier used to produce said applied sideband energy, means for mixing said high frequency sideband energy with said high frequency carrier current to produce sum and difference frequencies, and means for selecting the difference frequency produced in said mixing means, thereby to produce final sideband energy the frequency of which is varied as said last-named carrier current is varied in frequency.

References Cited in the file of this patent

UNITED STATES PATENTS

| | | |
|---|---|---|
| 2,444,534 | Salinger | July 6, 1948 |
| 2,499,279 | Peterson | Feb. 28, 1950 |
| 2,589,838 | McConnell | Mar. 18, 1952 |